(12) United States Patent
Zukauskas et al.

(10) Patent No.: US 7,990,045 B2
(45) Date of Patent: Aug. 2, 2011

(54) SOLID-STATE LAMPS WITH PARTIAL CONVERSION IN PHOSPHORS FOR RENDERING AN ENHANCED NUMBER OF COLORS

(75) Inventors: Arturas Zukauskas, Vilnius (LT);
Rimantas Vaicekauskas, Vilnius (LT);
Feliksas Ivanauskas, Vilnius (LT);
Henrikas Vaitkevicius, Vilnius (LT);
Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 329 days.

(21) Appl. No.: 12/401,057

(22) Filed: Mar. 10, 2009

(65) Prior Publication Data
US 2009/0261710 A1 Oct. 22, 2009

Related U.S. Application Data

(60) Provisional application No. 61/069,350, filed on Mar. 15, 2008.

(51) Int. Cl.
*H01L 33/00* (2010.01)
(52) U.S. Cl. ........................ 313/501; 313/502
(58) Field of Classification Search ........... 313/501–503
See application file for complete search history.

(56) References Cited

U.S. PATENT DOCUMENTS

| | | | |
|---|---|---|---|
| 4,176,294 A | 11/1979 | Thornton, Jr. | |
| 5,851,063 A | 12/1998 | Doughty et al. | |
| 6,234,645 B1 | 5/2001 | Borner et al. | |
| 6,817,735 B2 | 11/2004 | Shimizu et al. | |
| 6,890,085 B2 | 5/2005 | Hacker | |
| 7,008,078 B2 | 3/2006 | Shimizu et al. | |
| 7,332,106 B2 | 2/2008 | Yoshino et al. | |
| 7,597,821 B2 * | 10/2009 | Sakuma et al. | 252/301.4 F |
| 2004/0070736 A1 | 4/2004 | Roddy et al. | |

(Continued)

FOREIGN PATENT DOCUMENTS
JP H19-2007059898 A 3/2007

OTHER PUBLICATIONS

PCT, "Notification of Transmittal of the International Search Report and Written Opinion of the International Searching Authority, or the Declaration", Date of Mailing, Oct. 16, 2009, International Application No. PCT/US2009/036761.

(Continued)

*Primary Examiner* — Karabi Guharay
(74) *Attorney, Agent, or Firm* — John A. Merecki; Hoffman Warnick LLC (57) ABSTRACT

The invention relates to phosphor-conversion (PC) sources of white light, which are composed of at least two groups of emitters, such as blue electroluminescent light-emitting diodes (LEDs) and wide-band (WB) or narrow-band (NB) phosphors that partially absorb and convert the flux generated by the LEDs to other wavelengths, and to improving the quality of the white light emitted by such light sources. In particular, embodiments of the present invention describe new 3-4 component combinations of peak wavelengths and bandwidths for white PC LEDs with partial conversion. These combinations are used to provide spectral power distributions that enable lighting with a considerable portion of a high number of spectrophotometrically calibrated colors rendered almost indistinguishably from a blackbody radiator or daylight illuminant, and which differ from distributions optimized using standard color-rendering assessment procedures based on a small number of test samples.

20 Claims, 6 Drawing Sheets

U.S. PATENT DOCUMENTS

| | | | |
|---|---|---|---|
| 2005/0127833 A1* | 6/2005 | Tieszen | 313/512 |
| 2006/0104058 A1 | 5/2006 | Chemel et al. | |
| 2006/0186377 A1 | 8/2006 | Takahashi et al. | |
| 2006/0214175 A1 | 9/2006 | Tian | |
| 2008/0007172 A1 | 1/2008 | Tan et al. | |
| 2008/0258110 A1* | 10/2008 | Oshio | 252/301.6 R |
| 2009/0231832 A1* | 9/2009 | Zukauskas et al. | 362/84 |

OTHER PUBLICATIONS

PCT, "Notification of Transmittal of the International Search Report and Written Opinion of the International Searching Authority, or the Declaration", Date of Mailing, Oct. 16, 2009, International Application No. PCT/US2009/036763.

Dorothy Nickerson, "Optical Society of America (OSA) Uniform Color Scale Samples", JSTOR: Leonardo, vol. 12, No. 3, pp. 206-212, 1979.

Gunther Wyszecki et al., "Color Science Concepts and Methods Quantitative Data and Formulae", Second Edition, Wiley Classics Library Edition Published 2000, pp. 566-570.

Narukawa et al, "Recent Progress of High Efficiency White LEDs", Phys. Stat. Sol. (a) 204, No. 6, pp. 2087-2093, 2007.

Kimura et al, "Extrahigh Color Rendering White Light-Emitting Diode Lamps Using Oxynitride and Nitride Phosphors Excited by Blue Light-Emitting Diode", Applied Physics Letters 90, 2007.

Chih-Chieh Yang et al., "Highly Stable Three-Band White Light from an InGaN-based Blue Light-Emitting Diode Chip Precoated with (oxy)nitride Green/Red Phosphors", Applied Physics Letters 90, 123503, 2007.

P. Schlotter et al, "Rapid Communication, Luminescence Conversion of Blue Light Emitting Diodes", Applied Physics, A 64, pp. 417-418, 1997.

CIE, Publication No. 13.3, 1995.

Regina Mueller-Mach et al., "High-Power Phosphor-Converted Light-Emitting Diodes Based on III-Nitrides", IEEE Journal on Selected Topics in Quantum Electronics, vol. 8, No. 2, pp. 339-345, Mar./Apr. 2002.

Kaufmann et al., "Ultraviolet Pumped Tricolor Phosphor Blend White Emitting LED's", Phys. Stat. Sol. (a) 188, No. 1, pp. 143-146, 2001.

Shibata et al., "Fabrication of LED Based on III-V Nitride and its Applications", Phys. Stat. Sol. (a) 200, No. 1, pp. 58-61, 2003.

Regina Mueller-Mach, "Highly Efficient All-Nitride Phosphor-Converted White Light Emitting Diode", Phys. Stat. Sol. (a) 202, No. 9, pp. 1727-1732, 2005.

E. Fred Schubert et al., "Solid-State Lighting-a Benevolent Technology", Reports on Progress in Physics 69, pp. 3069-3099, 2006.

Shuji Nakamura et al., "The Blue Laser Diode, GaN Based Light Emitters and Lasers", Springer, Berlin, 1999.

E. Fred Schubert, "Light-Emitting Diodes", Cambridge, University, Cambridge, New York, 2006.

Shionoya et al., "Phosphor Handbook", CRC Press, 1999.

Dorothy Nickerson et al., "Munsell Renotations for Samples of OSA Uniform Color Scales", Journal of Optical Society of America, vol. 68, No. 10, pp. 1343-1347, Oct. 1978.

Roy S. Berns et al., "Development of the 1929 Munsell Book of Color: A Historical Review", Color Research Application 10, pp. 246-250, 1985.

Dousmanis et al., "Evidence of Refrigerating Action by Means of Photon Emission in Semiconductor Diodes", pp. A316-A318, Physical Review, vol. 133, No. 1A, Jan. 6, 1964.

Narendran et al., "Color Rendering Properties of LED Light Sources", pp. 61-67, Proceedings of SPIE, vol. 4776 © 2002.

Schubert et al., "Solid-State Light Sources Getting Smart ", pp. 1273-1278, Science, vol. 308, May 27, 2005, www.sciencemag.org.

Zukauskas et al., "Optimization of white polychromatic semiconductor lamps", Applied Physics Letter, vol. 80, No. 2, pp. 234-236, © 2002 American Institute of Physics.

Jeff Y. Tsao, "Solid-State Lighting" pp. 28-37, IEEE Circuits & Devices Magazine, May/Jun. 2004.

Steigerwald et al., "Illumination with Solid State Lighting Technology", pp. 310-320, IEEE Journal on Selected Topics in Quantum Electronics, vol. 8, No. 2, Mar./Apr. 2002.

Krames et al., "Status and Future of High-Power Light-Emitting Diodes for Solid-State Lighting", pp. 160-175, Journal of Display Technology, vol. 3, No. 2, Jun. 2007.

David L. Macadam, "Journal of the Optical Society of America", vol. 32, No. 5, pp. 247-274, May 1942.

Vitta et al., "White Complementary Solid-State Lamp", pp. 59-66, Leukos, vol. 1, No. 1, Jul. 2004.

Sandor et al., "Visual colour rendering based on colour difference evaluations", Lighting Research Technology, vol. 38, No. 3, pp. 225-239, 2006.

Shur et al., "Solid-State Lighting: Toward Superior Illumination", pp. 1691-1703, Proceedings of the IEEE, vol. 93, No. 10, Oct. 2005.

Zukauskas et al., "Solid State Lighting", pp. 1-132, Copyright © Wiley (2002), http://nina.ecse.rpi.edu/shur/.

Zukauskas et al., "Rendering a color palette by light-emitting diodes", Applied Physics Letter 93, © 2008 American Institute of Physics.

Lee Young Bae, PCT, "Notification of Transmittal of the International Search Report and Written Opinion of the International Searching Authority, or the Declaration", Date of Mailing, Sep. 1, 2009, International Application No. PCT/US2009/033730.

Yolaine Cussac, PCT, "Notification Concerning Transmittal of International Preliminary Report on Patentability", Date of Mailing Aug. 26, 2010, International Application No. PCT/US2009/033730.

Simin Baharlou, PCT, "Notification Concerning Transmittal of International Preliminary Report on Patentability", Date of Mailing Sep. 30, 2010, International Application No. PCT/US2009/036761.

Simin Baharlou, PCT, "Notification Concerning Transmittal of International Preliminary Report on Patentability", Date of Mailing Sep. 30, 2010, International Application No. PCT/US2009/036763.

Krames et al., "High-power truncated-inverted-pyramid . . . ", Applied Physics Letters, vol. 75, No. 16, Oct. 18, 1999, pp. 2365-2367.

Wierer et al., "High-power AlGaInN flip-chip light-emitting diodes", Applied Physics Letters, vol. 78, No. 22, May 28, 2001, pp. 3379-3381.

* cited by examiner

SOLID-STATE LAMPS WITH PARTIAL CONVERSION IN PHOSPHORS FOR RENDERING AN ENHANCED NUMBER OF COLORS

REFERENCE TO PRIOR APPLICATION

The current application claims the benefit of U.S. Provisional Application No. 61/069,350, entitled "Solid-State Lamp with Partial Conversion in Phosphors for Rendering an Enhanced Number of Rendered Colors," which was filed on Mar. 15, 2008, and which is hereby incorporated by reference.

TECHNICAL FIELD

Aspects of the invention relate to phosphor-conversion (PC) sources of white light, which are composed of at least two groups of emitters, such as blue electroluminescent light-emitting diodes (LEDs) and wide-band (WB) or narrow-band (NB) phosphors that partially absorb and convert the flux generated by the LEDs to light with other wavelengths, and to improving the color quality of the white light emitted by such light sources. In particular, embodiments of the present invention describe new 3-4 component combinations of peak wavelengths and bandwidths for white PC LEDs with partial conversion. These combinations are used to provide spectral power distributions that enable lighting with a considerable portion of a high number of spectrophotometrically calibrated colors rendered almost indistinguishably from a blackbody radiator or daylight illuminant, and which differ from distributions optimized using standard color-rendering assessment procedures based on a small number of test samples.

BACKGROUND ART

Composing white light from colored components in an optimum way has been a key problem of the lighting industry since the introduction of fluorescence lamps in the 1930s. Presently, the ability of white light to properly render the colors of illuminated objects is optimized by maximizing the general color rendering index, $R_a$, a figure of merit introduced by the International Commission of Illumination (Commission Internationale de l'Éclairage, CIE) in 1974 and updated in 1995 (CIE Publication No. 13.3, 1995). A trichromatic system with a maximized $R_a$ composed of red (610 nm), green (540 nm) and blue (450 nm) components (W. A. Thornton, U.S. Pat. No. 4,176,294, 1979) is widely accepted in lighting technology as the white light standard.

The development of efficient LEDs radiating in the short-wavelength range of the visible spectrum has resulted in the emergence of solid-state lighting. Since LEDs employ injection electroluminescence and potentially offer radiant efficiency that exceeds the physical limits of other sources of light, solid-state lighting is a tremendous lighting technology with the promise of the highest electric power conservation and vast environmental benefits.

Composite white light from LEDs can be obtained by means of partial or complete conversion of short-wavelength radiation in phosphors, using a set of primary LED chips with narrow-band emission spectra or a complementary use of both phosphor-conversion and colored LEDs. The phosphor-conversion approach based on UV and blue LEDs with complete or partial conversion in phosphors offers unsurpassed versatility in color control, since the peak wavelengths of the LEDs can be tailored by varying the chemical content and thickness of the active layers in the electroluminescent structures, and the peak wavelengths and the bandwidths of the phosphors can be tailored by varying the chemical content of the phosphor converters.

Using electroluminescent LEDs with different wavelengths and phosphors with different wavelengths and bandwidths allows for tailoring continuous illumination spectra similar to those of blackbody radiators or daylight illuminants, which are widely accepted as the ultimate-quality sources of white light. This requires the determination of LED and phosphor wavelengths and phosphor bandwidths providing the best possible quality of light for a given number of phosphors contained in a white light source, and the minimal number of phosphors with particular bandwidths required for attaining the ultimate quality of white light emitted by LEDs with partial or complete conversion.

The existing approach of assessing the color rendering properties of PC LEDs is based on the CIE 1995 procedure (CIE Publication No. 13.3, 1995), which traces back to halophosphate fluorescent lamp technology, and which employs the general color rendering index $R_a$ based on eight test color samples selected from the Munsell system of colors (and possibly additional six test color samples). This number of colors (eight to fourteen) is much smaller than that resolved by human vision and is not suitable for tailoring phosphor blends in white PC LEDs that are designed to emit light with ultimate color quality.

SUMMARY OF THE INVENTION

Aspects of the invention relate to phosphor-conversion (PC) sources of white light, which are composed of at least two groups of emitters, such as blue electroluminescent light-emitting diodes (LEDs) and wide-band (WB) or narrow-band (NB) phosphors that partially absorb and convert the flux generated by the LEDs to other wavelengths, and to improving the quality of the white light emitted by such light sources. In particular, embodiments of the present invention describe new 3-4 component combinations of peak wavelengths and bandwidths for white PC LEDs with partial conversion. These combinations are used to provide spectral power distributions that enable lighting with a considerable portion of a high number of spectrophotometrically calibrated colors rendered almost indistinguishably from a blackbody radiator or daylight illuminant, and which differ from distributions optimized using standard color-rendering assessment procedures.

A first aspect of the invention provides a lighting source, having a predetermined correlated color temperature, comprising: a light emitter comprising a blue electroluminescent light-emitting diode, having a peak wavelength, generating a flux that is partially absorbed and converted to other wavelengths by a set of phosphors, each phosphor having a primary color, peak (or average) wavelength, and bandwidth, and with the peak wavelengths and relative fluxes generated by the light-emitting diode and set of phosphors being selected such that in comparison with a reference lighting source, when each of more than fourteen different test color samples resolved by an average human eye as different is illuminated: (a) chromaticity shifts with a chromatic adaptation of human vision taken into account are preserved within corresponding regions of a chromaticity diagram, each containing all colors that are indistinguishable, to the average human eye, from a color at a center of the region; and (b) lightness shifts are preserved within predetermined values.

Another aspect of the invention provides a lighting method, comprising: generating white light, having a predetermined correlated color temperature, using a light emitter, the light emitter comprising a blue electroluminescent light-emitting diode, having a peak wavelength, generating a flux that is partially absorbed and converted to other wavelengths by a set of phosphors, each phosphor having a primary color, peak (or average) wavelength, and bandwidth, and with the peak wavelengths and relative fluxes generated by the light-emitting diode and set of phosphors being selected such that in comparison with a reference lighting source, when each of more than fourteen different test color samples resolved by an average human eye as different is illuminated: (a) chromaticity shifts with a chromatic adaptation of human vision taken into account are preserved within corresponding regions of a chromaticity diagram, each containing all colors that are indistinguishable, to the average human eye, from a color at a center of the region; and (b) lightness shifts are preserved within predetermined values.

Another aspect of the invention provides a method for generating white light having a predetermined correlated color temperature, comprising: selecting a light emitter including a blue electroluminescent light-emitting diode, having a peak wavelength, generating a flux that is partially absorbed and converted to other wavelengths by a set of phosphors, each phosphor having a primary color, peak (or average) wavelength, and bandwidth, and with the peak wavelengths and relative fluxes generated by the light-emitting diode and set of phosphors being selected such that in comparison with a reference lighting source, when each of more than fourteen different test color samples resolved by an average human eye as different is illuminated: (a) chromaticity shifts with a chromatic adaptation of human vision taken into account are preserved within corresponding regions of a chromaticity diagram, each containing all colors that are indistinguishable, to the average human eye, from a color at a center of the region; and (b) lightness shifts are preserved within predetermined values.

Other aspects of the invention may include and/or implement some or all of the features described herein. The illustrative aspects of the invention are designed to solve one or more of the problems herein described and/or one or more other problems not discussed.

DETAILED DESCRIPTION OF THE INVENTION

In accordance with embodiments of the present invention, a lighting source having a predetermined correlated color temperature is provided. The lighting source comprises phosphor-conversion (PC) sources of white light, which are composed of at least two groups of emitters, such as blue electroluminescent light-emitting diodes (LEDs) and wide-band (WB) or narrow-band (NB) phosphors that partially absorb and convert the flux generated by the LEDs to other wavelengths. Embodiments of the present invention describe new 3-4 component combinations of peak (or average) wavelengths and bandwidths for white PC LEDs with partial conversion. These combinations are used to provide spectral power distributions that enable lighting with a considerable portion of a high number of spectrophotometrically calibrated colors rendered almost indistinguishably from a blackbody radiator or daylight illuminant, and which differ from distributions optimized using standard color-rendering assessment procedures. As used herein, unless otherwise noted, the term "set" means one or more (i.e., at least one) and the phrase "any solution" means any now known or later developed solution.

DEFINITIONS

Electroluminescent LED—light emitting diode, which converts electric power to light due to electroluminescence.

Phosphor—a substance that converts light of particular wavelengths (usually shorter ones) to light with other wavelengths (usually longer ones) due to photoluminescence.

White phosphor-conversion (PC) LED—a solid-state lamp in which radiation emitted from an electroluminescent LED is completely or partially absorbed and converted in one or a plurality of phosphors in order to generate white light by means of color mixing.

Partial-conversion PC LED—a PC LED that contains an electroluminescent LED emitting blue light and one or a plurality of phosphors that partially absorb and convert a portion of the flux generated by the electroluminescent LED to light with other wavelengths in such a way that a mixture of the residual blue light and the light generated by the phosphor(s) is perceived as white light.

Color space—a model for mathematical representation of a set of colors.

Munsell samples—a set of color samples introduced by Munsell and then updated, such that each sample is characterized by the hue, value (lightness scale), and chroma (color purity scale).

MacAdams ellipses—the regions on the chromaticity plane of a color space that contain all colors which are almost indistinguishable, to the average human eye, from the color at the center of the region.

Standard illuminant—a standardized spectral power distribution of visible light, which allows colors recorded under different lighting to be compared, such as of blackbody radiator or reconstituted daylight-phase illuminant.

Embodiments of the present invention provide sources of white light nearly identical to a blackbody radiator or daylight-phase illuminant in terms of its perception by the human eye. In order to characterize and compare different sources of white light, aspects of the invention introduce a characteristic of the light source related to the rendering of colors of illuminated objects, which is used to evaluate the white light source quality.

To characterize the quality of white light, embodiments of the present invention provide an advanced color rendering assessment procedure. A common approach for the assessment of the color-rendering properties of a light source is based on the estimation of color differences (e.g., shifts of the color coordinates in an appropriate color space) for test samples when the source under consideration is replaced by a reference source (e.g., blackbody radiator or reconstituted daylight illuminant). The standard CIE 1995 procedure, which initially was developed for the rating of halophosphate fluorescent lamps with relatively wide spectral bands, and which was later refined and extended, employs only eight to fourteen test samples from the vast palette of colors originated by the artist A. H. Munsell in 1905. When applied to sources composed of narrow-band emitters, such as LEDs, the CIE 1995 procedure receives criticism that is mainly due to the small number of test samples (eight to fourteen) employed. Another drawback is the use of equally treated shifts for all samples in a color space, which lacks uniformity in terms of perceived color differences. In fact, the CIE 1960 Uniform Chromaticity Scale (UCS) space, which is employed in the standard color rendering assessment procedure, is completely symmetrized only around the very central point.

Aspects of the present invention are based on using a much larger number of test samples and on the color differences distinguished by human vision for each of these samples. To this end, the entire Munsell palette is employed, which specifies the perceived colors in three dimensions: hue; chroma (saturation); and value (lightness). A spectrophotometrically calibrated set of 1269 Munsell samples is used, which (with some exceptions for highly saturated colors) can be referred to as all colors of the real world. The Joensuu Spectral Database, available from the University of Joensuu Color Group, is an example of a spectrophotometrically calibrated set of 1269 Munsell samples that can be used in the practice of an embodiment of the present invention.

The perceived color differences are evaluated using MacAdam ellipses, which are the experimentally determined regions in the chromaticity diagram (hue-saturation plane), containing colors that are almost indistinguishable by human vision. A nonlinear interpolation of the ellipses determined by MacAdam for 25 colors is employed to obtain the ellipses for the entire 1269-element Munsell palette. For instance, using the inverse distance weighted (geodesic) method, an ellipse centered at the chromaticity coordinates (x, y) has an interpolated parameter (a minor or major semiaxis or an inclination angle) given by the formula $$P(x, y) = \sum_{n=1}^{25} h_i^{-2} P_0(x_{0i}, y_{0i}) \bigg/ \sum_{n=1}^{25} h_i^{-2},$$

where $P_0(x_{0i}, y_{0i})$ is a corresponding experimental parameter, and $h_i$ is the distance from the center of the interpolated ellipse to an original MacAdam ellipse $$h_i = \sqrt{(x-x_{0i})^2 + (y-y_{0i})^2}.$$

In an embodiment, a rendered chromaticity of a sample is defined as that which shifts only within the 3-step MacAdam ellipse (i.e., by less than three radii of the ellipse) with the chromatic adaptation taken into account (e.g., in the way used in CIE Publication No. 13.3, 1995). Further, in an embodiment, the allowed difference in lightness (the third coordinate) is set to 2% for all the samples. If the color point moves out of such an elliptical cylinder when switching from the reference illuminant to that under test, the distortion of the sample color will be noticed by over 99% of individuals with normal vision. As a figure of merit for the overall assessment of color rendering properties of a lamp, embodiments of the present invention utilize a new methodology involving a Number of Rendered Colors (also named as Color Fidelity Index), $N_r$, measured in percents in respect of the total number of the test Munsell samples (1269), which is the proposed alternative to the general color rendering index $R_a$ based on eight test samples.

Aspects of the present invention perform optimization of white phosphor-conversion LEDs with partial conversion for different numbers n of spectral components (e.g., n equal to two, three, or four) to attain the highest number of rendered colors $N_r$ for a set of colors, such as the aforementioned spectrophotometrically calibrated set of 1269 Munsell samples. Correlated color temperatures in the entire relevant range of 2500 K to 10000 K are used. In particular, the color temperature of 6500 K is of importance, since it almost fits the chromaticity of daylight.

The employed spectral components comprise Gaussian shapes, which are very similar to spectral shapes of the emission bands of electroluminescent LEDs and most real phosphors. The spectra of partial-conversion LEDs are simulated using the shortest-wavelength band with a full width at half magnitude (FWHM, $\Delta$) of 30 nm (typical of InGaN electroluminescent LEDs) and at least one phosphor band. One set of solutions is obtained for phosphors with emission bands of equal FWHM that are designated here as wide-band (WB) phosphors. In another set, the longest-wavelength phosphor was preset to a 10-nm bandwidth (narrow-band, NB, phosphor) in order to mimic a rear-earth activator with screened (4f-4f) transitions, such as in $Eu^{3+}$, $Sm^{3+}$, or $Pr^{3+}$.

A method of optimization in the 2n-dimensional parametric space of peak wavelengths and relative fluxes is applied in order to maximize $N_r$. For example, with a gradual increase of the bandwidth of the WB phosphors, $N_r$ is continually maximized until the peak value (100%) is attained. At that point, the optimization routine is terminated and the peak wavelengths of the primary emitters and the width of the WB phosphor bands are recorded. To rate the energy-conversion usefulness of each ultimate-quality solution, luminous efficacy of radiation, which is the ratio of luminous and radiant fluxes, is determined as well.

The optimized spectral power distributions that provide the ultimate quality of white light are discussed below. These spectra with $N_r = 100\%$ have the general color rendering indexes (CRIs) of 96-98 points, whereas common PC LEDs with partial conversion in YAG:Ce$^{3+}$ ("cool-white") and in diphosphor blend ("warm-white") render about 20% ($R_a \approx 70$) and 70% ($R_a \approx 90$) of the palette, respectively. The indicated bandwidths of the WB phosphors are the smallest required (larger widths do not decrease the quality of light but they can result in shifting of the peaks and reduced luminous efficacy of radiation). For non-Gaussian shapes of electroluminescent LED and phosphor bands, the indicated peak wavelengths might somewhat differ but are still close to the average wavelengths. If the emission band is noticeably asymmetric, the average wavelength might be more meaningful than the peak wavelength. To this extent, in the following discussion, one can use an average wavelength in place of a peak wavelength.

Figure 1:
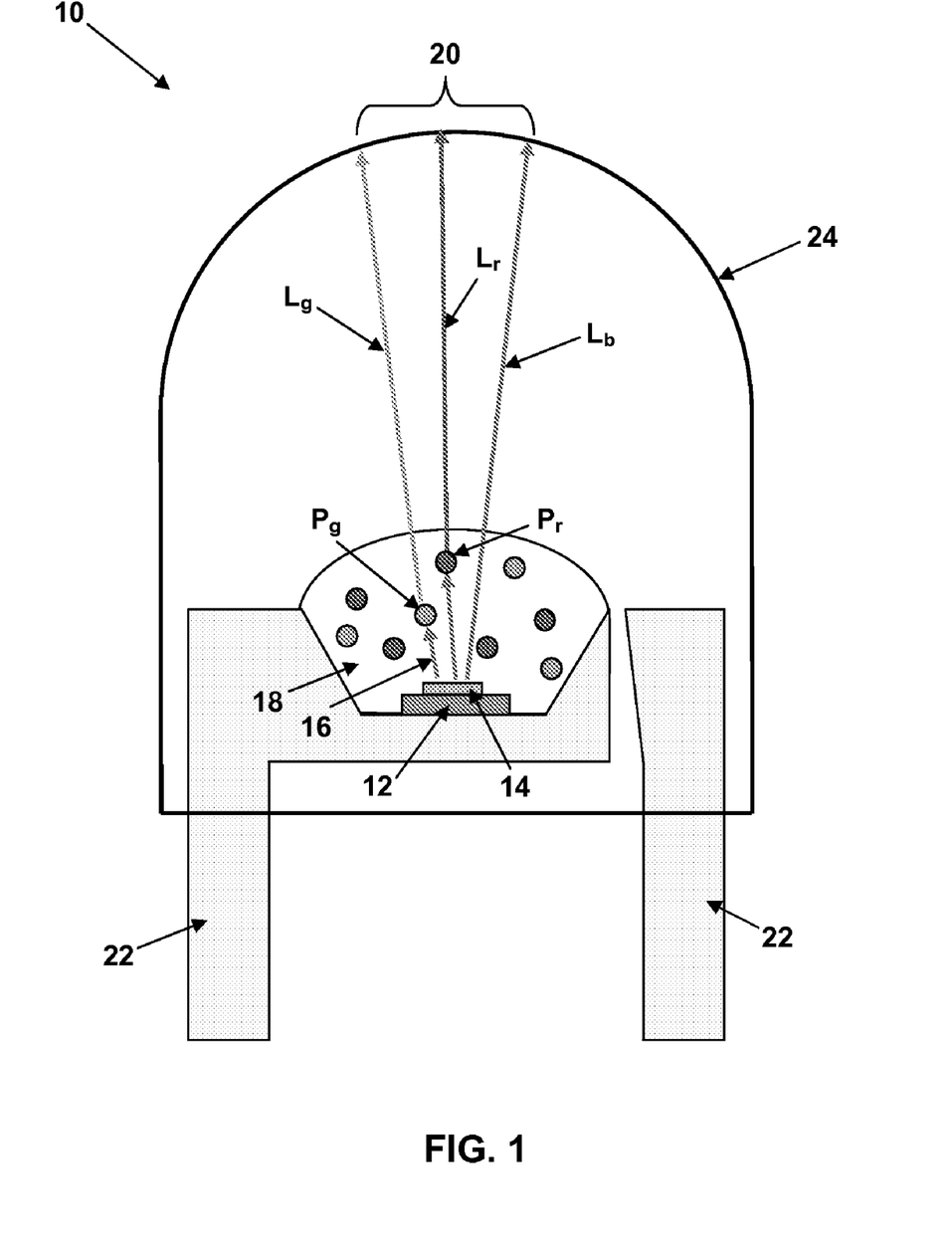
FIG. 1 depicts a schematic diagram of an illustrative partial conversion white phosphor-conversion (PC) light emitting diode (LED) according to an embodiment.

FIG. 1 shows a schematic diagram of a partial conversion white PC LED 10 in accordance with embodiments of the present invention. The white PC LED 10 includes a semiconductor chip 12 containing an electroluminescent LED 14 that is configured to emit blue light 16 with, for example, a peak wavelength in a range of about 430-475 nm and a bandwidth of about 30 nm, and a phosphor converter layer 18 including a plurality of phosphors that partially absorb and convert the flux generated by the diode 14 to light with different wavelengths. The light emitted by the phosphors, when mixed with the residual blue light $L_b$ emitted by the LED 14 and passing through the phosphor converter layer 18, is perceived as white light 20. In this example, the phosphor converter layer 18 includes two different phosphors, namely a "red" phosphor $P_r$, and a "green" phosphor $P_g$. The red phosphor $P_r$ converts the flux generated by the diode 14 to visible red light $L_r$, while the green phosphor $P_g$, converts the flux generated by the diode 14 to visible green light $L_g$. The semiconductor chip 12 is coupled (not shown) to electrical leads 22, and the semiconductor chip 12 and phosphor converter layer 18 are disposed within an enclosure 24.

In accordance with this and other embodiments of the present invention, the peak wavelengths and relative fluxes of the electroluminescent LED 14 and plurality of phosphors in the white PC LED 10 are selected to maximize the number of rendered colors $N_r$, such that, when compared to a reference lighting source, when each of more than fourteen test color samples resolved by an average human eye as different is illuminated: (a) chromaticity shifts with a chromatic adaptation of human vision taken into account are preserved within corresponding regions of a chromaticity diagram, each containing all colors that are indistinguishable, to the average human eye, from a color at a center of the region; and (b) lightness shifts are preserved within predetermined values. For example, in an embodiment, the peak wavelengths and relative fluxes can be selected such that in comparison with a reference source for the illuminated test color samples the chromaticity shifts are preserved within 3-step MacAdam ellipses and the lightness shifts are preserved within 2%. The relative fluxes generated by each of the phosphors can be controlled via at least one of: the concentration of the phosphor particles in the phosphor converter layer 18; the thickness of the phosphor converter layer 18; the refraction index of the materials forming the phosphor converter layer 18; the distance of the phosphor converter layer 18 from the LED 14; the location of the phosphor converter layer 18 within the enclosure 24, and/or the like. The unabsorbed relative flux of the LED 14 can be controlled via the driving current and/or absorption in the phosphor(s).

Figure 2:
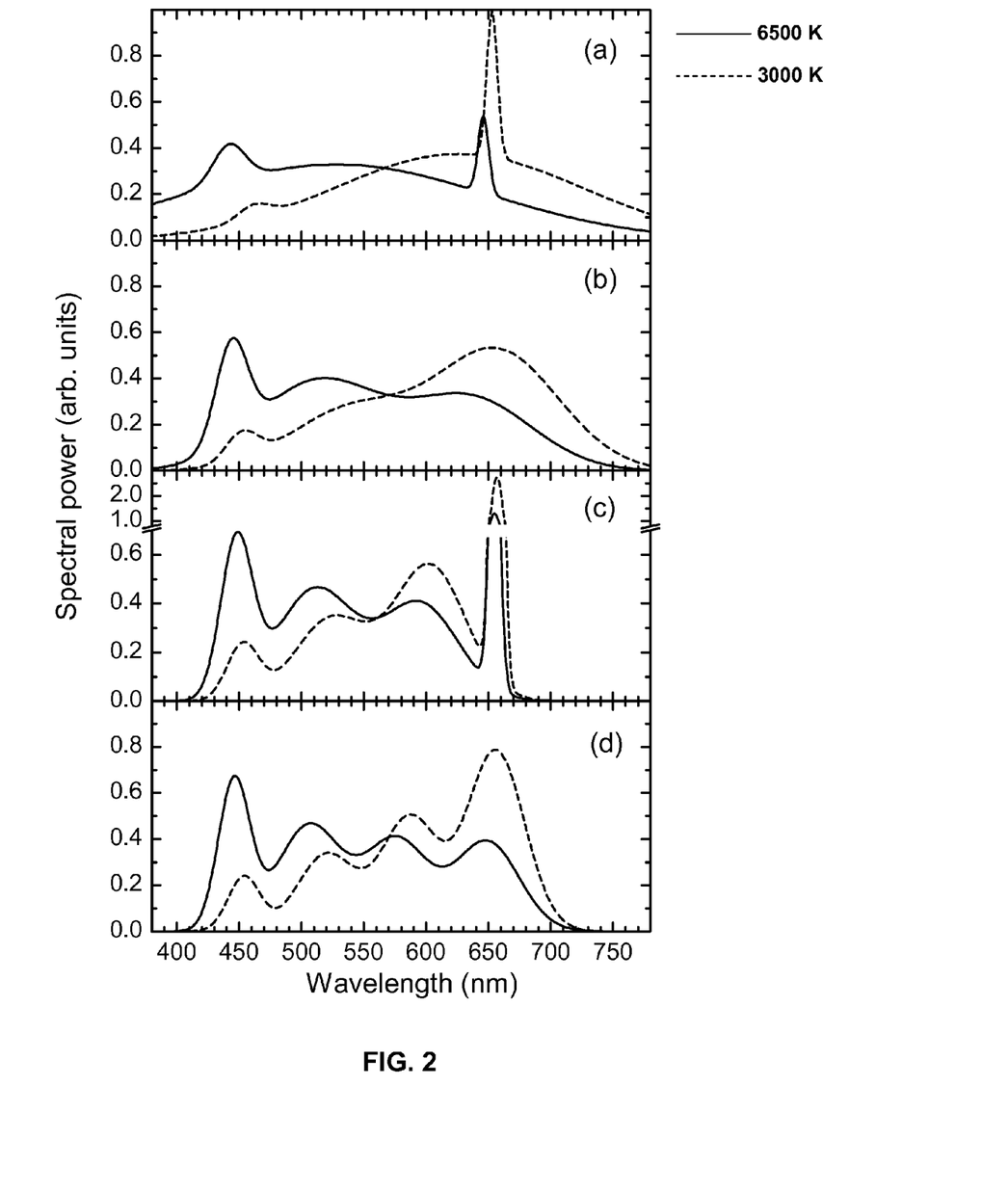
FIG. 2 depicts illustrative optimization results for the emission spectra of white PC LEDs with partial conversion provided in accordance with aspects of the present invention.

FIG. 2 and Table 1 show the optimization results provided in accordance with aspects of the present invention for white PC LEDs with partial conversion.

TABLE 1

| Converter Phosphors | Color Temperature (K) | Blue LED (Δ = 30 nm) Peak (nm) | Wide-Band Phosphors | | | | Narrow-Band | Luminous |
| | | | Bandwidth (nm) | Green Peak (nm) | Yellow Peak (nm) | Red Peak (nm) | (Δ = 10 nm) Red Phosphor Peak (nm) | Efficacy of Radiation (lm/W) |
|---|---|---|---|---|---|---|---|---|
| 1 WB + 1 NB | 3000 | 462 | 235 | — | — | 626 | 653 | 210 |
|  | 6500 | 442 | 286 | 528 | — | — | 646 | 212 |
| 2 WB | 3000 | 452 | 116 | 540 | — | 657 |  | 234 |
|  | 6500 | 444 | 116 | 513 | — | 635 |  | 257 |
| 2 WB + 1 NB | 3000 | 453 | 68 | 524 | 603 | — | 657 | 286 |
|  | 6500 | 448 | 73 | 511 | 595 | — | 655 | 278 |
| 3 WB | 3000 | 454 | 54 | 520 | 587 | 656 |  | 269 |
|  | 6500 | 446 | 60 | 506 | 576 | 649 |  | 270 |

The solid lines in FIG. 2 show the spectra with a color temperature of 6500 (e.g., daylight), whereas the dashed lines show the spectra with a color temperature of 3000 K (e.g., warm white/halogen). Table 1 presents the corresponding peak wavelengths of the blue electroluminescent LED and phosphors, as well as the minimal bandwidths of the WB phosphors. A trichromatic solution employing a blue LED with a WB green phosphor and NB red phosphor (a) is difficult to implement because of the lack of currently available extra-WB (Δ>200 nm) phosphors. When a WB phosphor is substituted for the red NB phosphor (b), the required bandwidth is closer to a practical bandwidth (Δ>116 nm), but is still difficult to implement. Tetrachromatic solutions with three phosphors of reasonable bandwidth (~50-70 nm) are more realistic. A highest efficacy can be attained in a partial-conversion LED with green and yellow WB phosphors and a NB red phosphor (c). The peak wavelength of the NB phosphor (around 655 nm) is somewhat longer in comparison with those of common 4f-4f phosphors, which have narrow red lines in the range of 610-630 nm. A more feasible solution is a partial-conversion PC LED with the LED chip emitting blue light at about 450 nm and a triphosphor blend containing green (~510 nm), yellow (~580 nm), and red (~650 nm) WB phosphors (d), although increasing the width of the red band from 10 nm to about 60 nm decreases luminous efficacy of radiation by ~6%. Many green and yellow phosphors with excitation spectra in the blue region and a bandwidth in excess of 50 nm are available, whereas the phosphors of choice for the red WB component can comprise, for example, Eu$^{2+}$-activated nitrides or oxynitrides.

FIGS. 3 to 6 show the peak wavelengths (a) and relative radiant fluxes (b) of the blue electroluminescent LED and phosphors, and the minimal bandwidth of the WB phosphors, as functions of correlated color temperature for optimized white PC LEDs with partial conversion with different numbers and types of phosphors, determined in accordance with aspects of the present invention. Connecting lines in FIGS. 3 to 6 are provided merely as guides to the eye.

Figure 3:
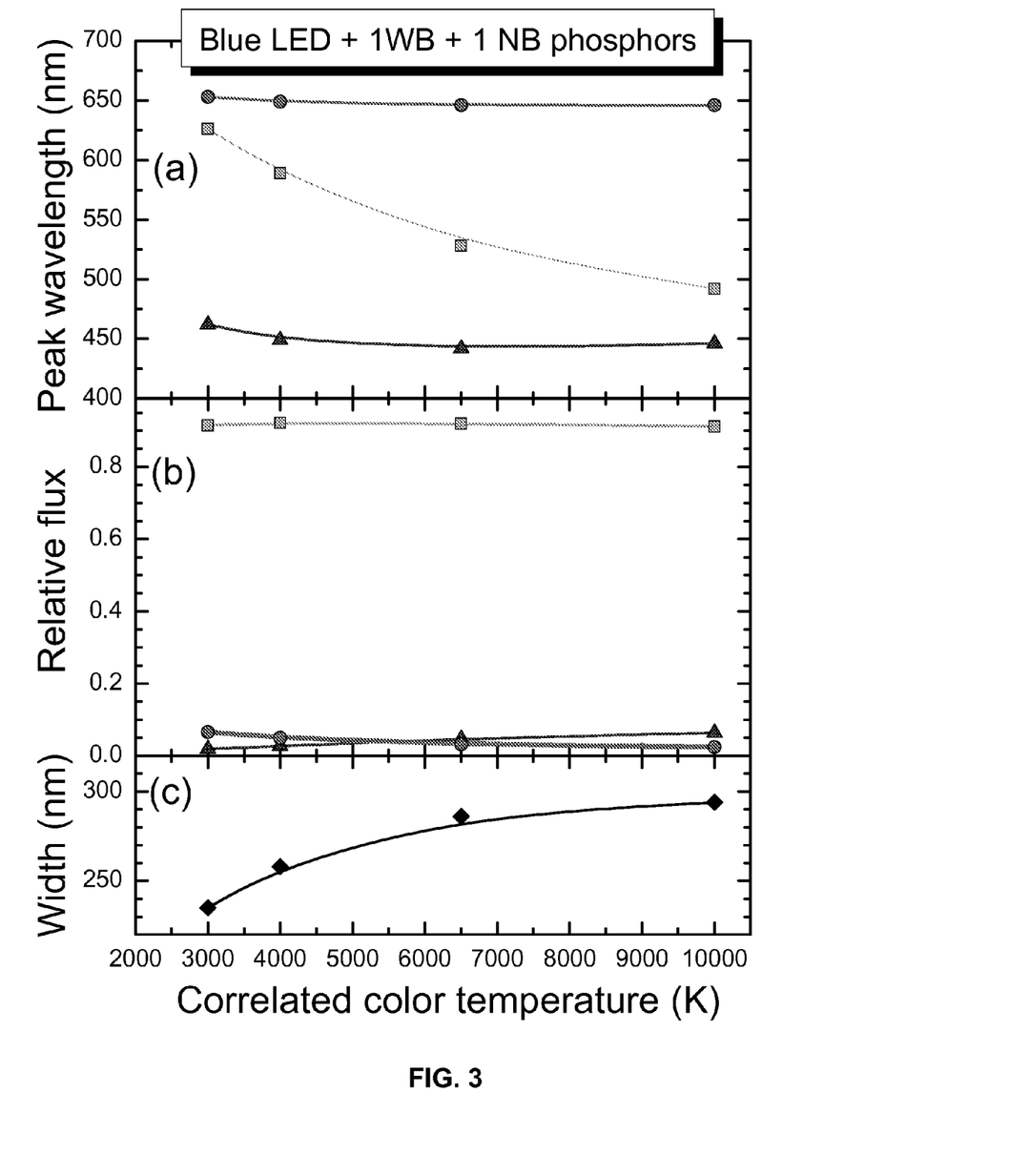
FIG. 3 shows peak positions (a) and relative radiant fluxes (b) of the blue LED and phosphors, and the minimal bandwidth (c) of the WB phosphor, as functions of correlated color temperature for white PC LEDs with partial conversion of blue light in one WB phosphor and one red NB phosphor, with all 1269 colors of the spectrophotometrically calibrated Munsell palette rendered, according to an embodiment.

FIG. 3 shows peak positions (a) and relative radiant fluxes (b) of the blue electroluminescent LED and phosphors, and the minimal bandwidth (c) of the WB phosphor, as functions of correlated color temperature for white PC LEDs with partial conversion of blue light in one WB phosphor and one red NB phosphor, with all 1269 colors of the spectrophotometrically calibrated Munsell palette rendered.

Based on data such as that provided in Table 1 and FIGS. 2 and 3, an embodiment of an optimized white PC LED provided in accordance with the present invention comprises: an electroluminescent LED with a peak wavelength in a range of about 430 to 475 nm, a NB phosphor with a peak wavelength in a range of about 630 to 670 nm, and a WB phosphor with a bandwidth of at least about 180 nm and a peak wavelength in an interval of about 480 to 630 nm, with a correlated color temperature in the range of about 2500 to 10000 K set by adjusting the relative fluxes generated by the LED and each of the phosphors, when the chromaticity and lightness shifts are preserved for more than about 1000 different test color samples of 1269 spectrophotometrically calibrated samples of the Munsell palette. Another embodiment provides an optimized white PC LED with a correlated color temperature of about 6500 K, comprising an electroluminescent LED with a peak wavelength of about 442 nm and an unabsorbed relative radiant flux of about 0.05, a NB phosphor with a bandwidth of about 10 nm, peak wavelength of about 646 nm, and relative radiant flux of about 0.03, and a WB phosphor with a bandwidth of at least about 240 nm, peak wavelength of about 528 nm, and relative radiant flux of about 0.92, when the chromaticity and lightness shifts are preserved for more than about 1200 different test color samples of 1269 spectrophotometrically calibrated samples of the Munsell palette.

Figure 4:
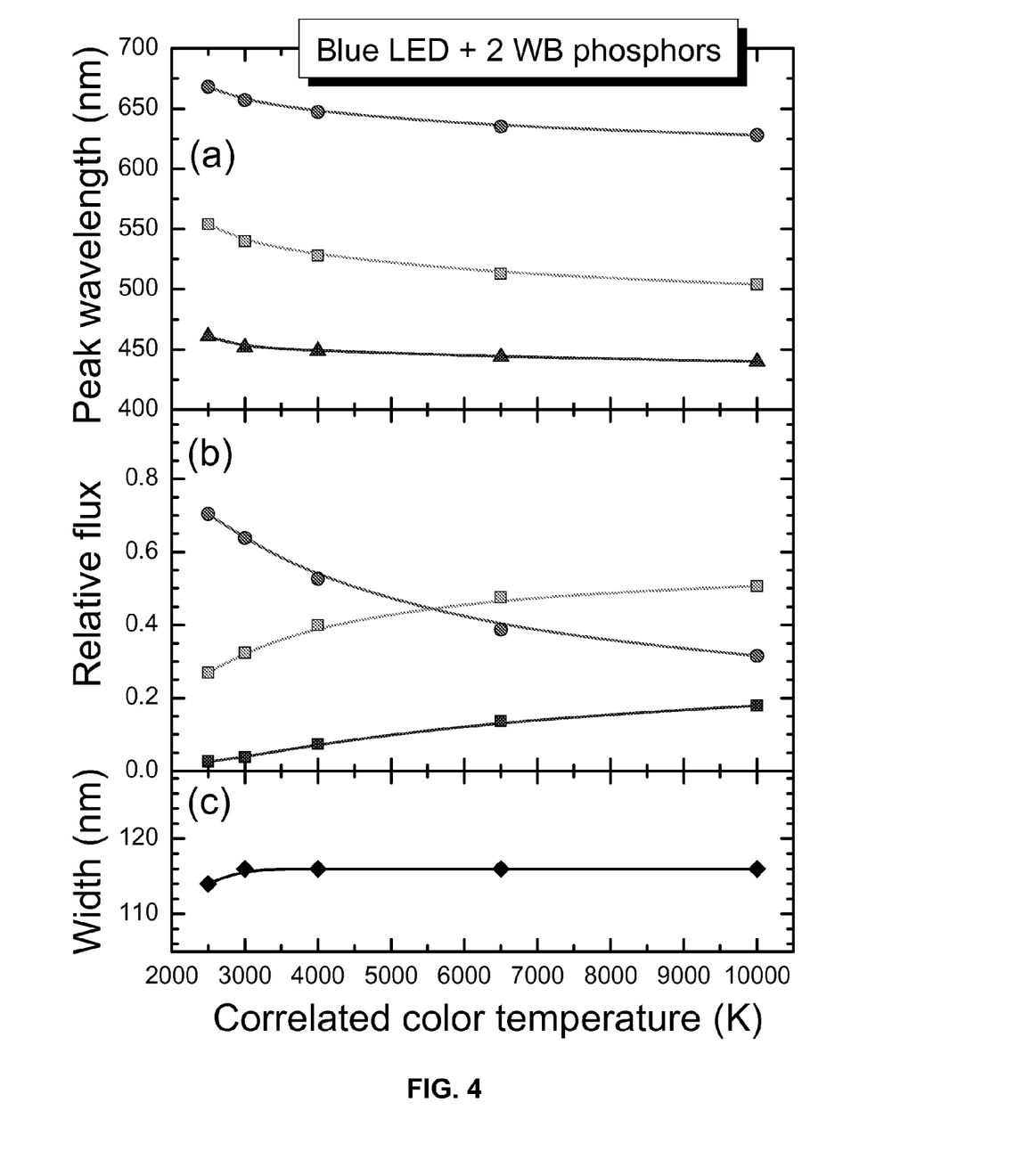
FIG. 4 depicts the peak positions (a) and relative radiant fluxes (b) of the blue LED and WB phosphors, and the minimal bandwidth (c) of the WB phosphors, as functions of correlated color temperature for white PC LEDs with partial conversion of blue light in two WB phosphors, with all 1269 colors of the spectrophotometrically calibrated Munsell palette rendered, according to an embodiment.

FIG. 4 depicts the peak positions (a) and relative radiant fluxes (b) of the blue electroluminescent LED and WB phosphors, and the minimal bandwidth (c) of the WB phosphors, as functions of correlated color temperature for white PC LEDs with partial conversion of blue light in two WB phosphors, with all 1269 colors of the spectrophotometrically calibrated Munsell palette rendered.

Based on data such as that provided in Table 1 and FIGS. 2 and 4, an embodiment of an optimized white PC LED provided in accordance with the present invention comprises: an electroluminescent LED with a peak wavelength in a range of about 430 to 475 nm, two WB phosphors with bandwidths of at least about 90 nm and peak wavelengths in a range of about 490 to 570 nm and 615 to 680 nm, respectively, with a correlated color temperature in a range of about 2500 to 10000 K set by adjusting the relative fluxes generated by the LED and each of the phosphors, and wherein the chromaticity and lightness shifts are preserved for more than about 1000 different test color samples of 1269 spectrophotometrically calibrated samples of the Munsell palette. Another embodiment provides an optimized white PC LED with a correlated color temperature of about 6500 K, comprising: an electroluminescent LED with a peak wavelength of about 444 nm and an unabsorbed relative radiant flux of about 0.14, two WB phosphors with bandwidths of at least about 100 nm, peak wavelengths of about 513 nm and 635 nm, respectively, and relative radiant fluxes of about 0.47 and 0.39, respectively, wherein the chromaticity and lightness shifts are preserved for more than about 1200 different test color samples of 1269 spectrophotometrically calibrated samples of the Munsell palette.

Figure 5:
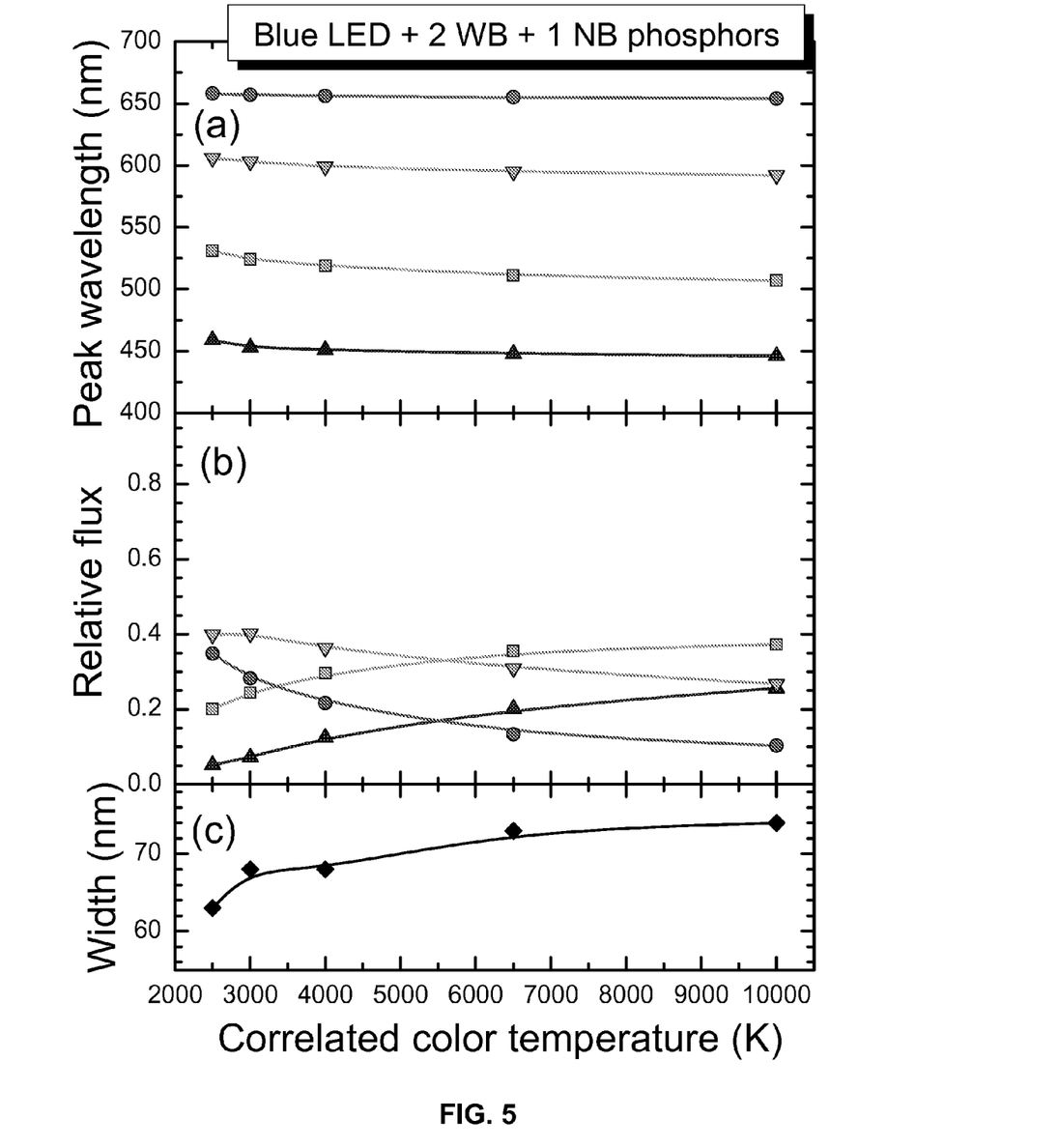
FIG. 5 depicts the peak positions (a) and relative radiant fluxes (b) of the blue LED and phosphors, and the minimal bandwidth (c) of the WB phosphors, as functions of correlated color temperature for white PC LEDs with partial conversion of blue light in two WB phosphors and one red NB phosphor, with all 1269 colors of the spectrophotometrically calibrated Munsell palette rendered, according to an embodiment.

FIG. 5 depicts the peak positions (a) and relative radiant fluxes (b) of the blue electroluminescent LED and phosphors, and the minimal bandwidth (c) of the WB phosphors, as functions of correlated color temperature for white PC LEDs with partial conversion of blue light in two WB phosphors and one red NB phosphor, with all 1269 colors of the spectrophotometrically calibrated Munsell palette rendered.

Based on data such as that provided in Table 1 and FIGS. 2 and 5, an embodiment of an optimized white PC LED provided in accordance with the present invention comprises: an electroluminescent LED with a peak wavelength in a range of about 430 to 475 nm, a NB phosphor with a peak wavelength in a range of about 640 to 675 nm, and two WB phosphors with bandwidths of at least about 50 nm and peak wavelengths in a range of about 490 to 545 nm and 575 to 620 nm, respectively, with the correlated color temperature in the range of about 2500 to 10000 K set by adjusting the relative fluxes generated by the LED and each of the phosphors, when the chromaticity and lightness shifts are preserved for more than about 1000 different test color samples of 1269 spectrophotometrically calibrated samples of the Munsell palette. Another embodiment provides an optimized white PC LED with a correlated color temperature of about 6500 K, comprising an electroluminescent LED with a peak wavelength of about 448 nm and an unabsorbed relative radiant flux of about 0.20, a NB phosphor with a bandwidth of about 10 nm, peak wavelength of about 655 nm, and relative radiant flux of about 0.13, and two WB phosphors with bandwidths of at least about 60 nm, peak wavelengths of about 511 nm and 595 nm, respectively, and relative radiant fluxes of about 0.36 and 0.31, respectively, when the chromaticity and lightness shifts are preserved for more than about 1200 different test color samples of 1269 spectrophotometrically calibrated samples of the Munsell palette.

Figure 6:
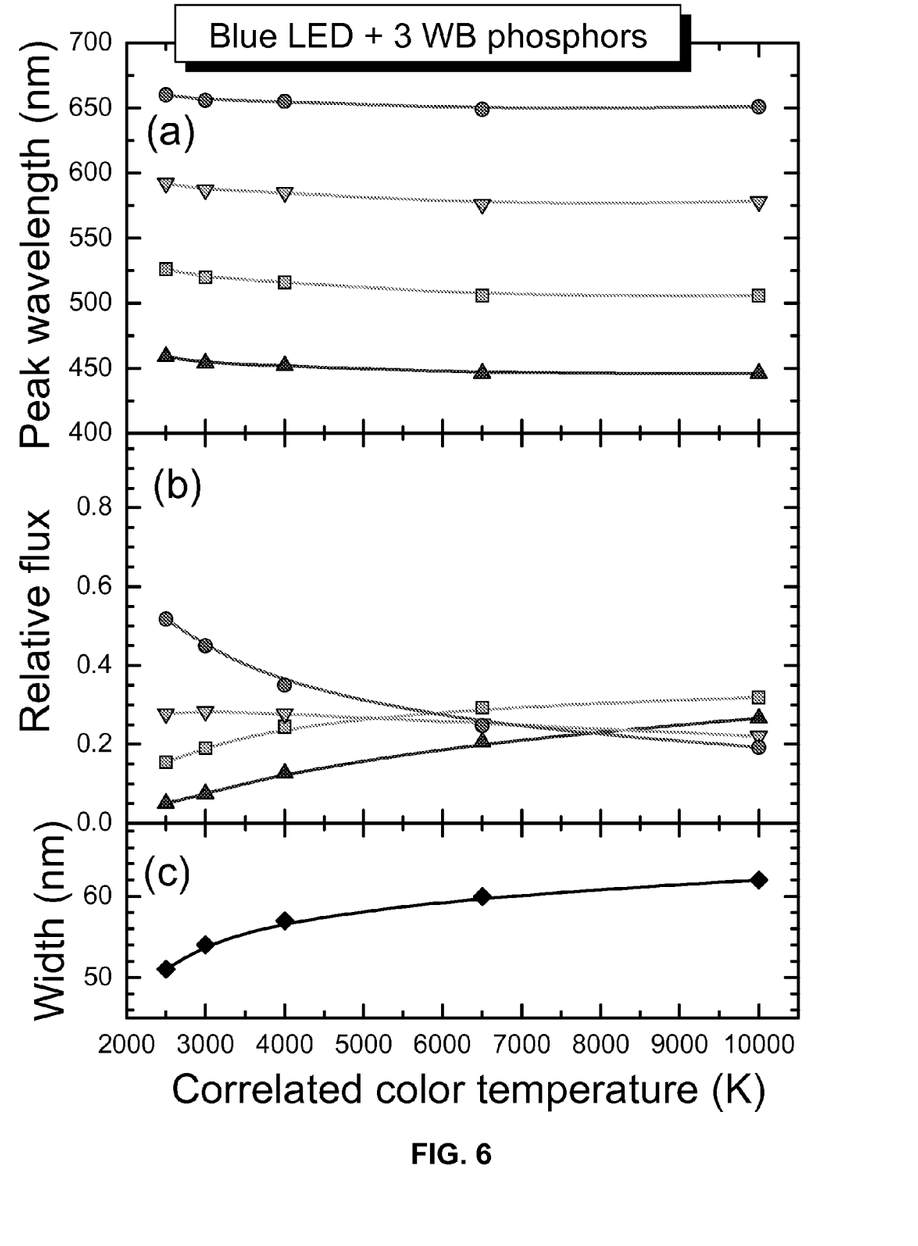
FIG. 6 depicts the peak positions (a) and relative radiant fluxes (b) of the blue LED and WB phosphors, and the minimal bandwidth (c) of the WB phosphors, as functions of correlated color temperature for white PC LEDs with partial conversion of blue light in three WB phosphors, with all 1269 colors of the spectrophotometrically calibrated Munsell palette rendered, according to an embodiment.

FIG. 6 depicts the peak positions (a) and relative radiant fluxes (b) of the blue electroluminescent LED and WB phosphors, and the minimal bandwidth (c) of the WB phosphors, as functions of correlated color temperature for white PC LEDs with partial conversion of blue light in three WB phosphors, with all 1269 colors of the spectrophotometrically calibrated Munsell palette rendered.

Based on data such as that provided in Table 1 and FIGS. 2 and 6, an embodiment of an optimized white PC LED provided in accordance with the present invention comprises: an electroluminescent LED with a peak wavelength in a range of about 430 to 475 nm, three WB phosphors with bandwidths of at least about 40 nm and peak wavelengths in a range of about 490 to 540 nm, 565-605 nm, and 635-675 nm, respectively, with a correlated color temperature in a range of about 2500 to 10000 K set by adjusting the relative fluxes generated by the LED and each of the phosphors, when the chromaticity and lightness shifts are preserved for more than 1000 different test color samples of 1269 spectrophotometrically calibrated samples of the Munsell palette. Another embodiment provides an optimized white PC LED with a correlated color temperature of about 6500 K, comprising an electroluminescent LED with a peak wavelength of about 446 nm and an unabsorbed relative radiant flux of about 0.21, three WB phosphors with bandwidths of at least about 50 nm, peak wavelengths of about 506 nm, 576 nm, and 649 nm, respectively, and relative radiant fluxes of about 0.29, 0.25, and 0.25, respectively, when the chromaticity and lightness shifts are preserved for more than 900 different test color samples of 1269 spectrophotometrically calibrated samples of the Munsell palette.

To compare the optimization approaches based on $N_r$ and $R_a$, respectively, spectral power distributions with the same number and bandwidths of phosphors as discussed above were determined, but with the maximized general rendering index $R_a$. Generally, such optimization results in a shift to shorter wavelengths of all these spectra in comparison with those discussed above, with the most pronounced shift of the red component (e.g., up to 30 nm). The color rendering index optimization resulted in an increased efficacy (by up to 20%) but at the expense of rendering loss for some red and many purple colors (up to 5% of total colors).

Further objects and advantages are to provide a design for the high quality solid state white light source that can be used to replicate sunlight in any color-sensitive applications, such as filming, photographing, and designing, in medicine for the seasonal disease treatment and prophylactics, in psychology for depression treatment and prophylactics, etc. The same method based on the evaluation of the number of rendered colors $N_r$, from a given set of samples can be used for color compensation calibrations in digital cameras, color printing, and other applications.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A lighting source, having a predetermined correlated color temperature, comprising:
   a light emitter comprising a blue electroluminescent light-emitting diode, having a peak wavelength, generating a flux that is partially absorbed and converted to other wavelengths by a set of phosphors, each phosphor having a primary color, peak wavelength, and bandwidth, and with the peak wavelengths and relative fluxes generated by the light-emitting diode and the set of phosphors being selected such that in comparison with a reference lighting source, when each of more than fourteen different test color samples resolved by an average human eye as different is illuminated:
   (a) chromaticity shifts with a chromatic adaptation of human vision taken into account are preserved within corresponding regions of a chromaticity diagram, each containing all colors that are indistinguishable, to the average human eye, from a color at a center of the region; and
   (b) lightness shifts are preserved within predetermined values.

2. The lighting source of claim 1, wherein the light-emitting diode has a peak wavelength in a range of about 430 to 475 nm and a bandwidth of about 30 nm, and wherein at least one of the phosphors partially absorbs and converts the flux generated by the light-emitting diode, with the correlated color temperature in a range of about 2500 to 10000 K set by adjusting the relative fluxes generated by the light-emitting diode and each of the phosphors.

3. The lighting source of claim 1, wherein the peak wavelengths and relative fluxes are selected such that, in comparison with a reference source for the illuminated test color samples, the chromaticity shifts are preserved within 3-step MacAdam ellipses and the lightness shifts are preserved within 2%.

4. The lighting source of claim 3, wherein the light-emitting diode has a peak wavelength in a range of about 430 to 475 nm and a bandwidth of about 30 nm, and wherein at least one of the phosphors partially absorbs and converts the flux generated by the light-emitting diode, with the correlated color temperature in a range of about 2500 to 10000 K set by adjusting the relative fluxes generated by the light-emitting diode and each of the phosphors.

5. The lighting source of claim 1, wherein the light-emitting diode has a peak wavelength in a range of about 430 to 475 nm and the set of phosphors comprises two phosphors with bandwidths of at least about 90 nm and peak wavelengths in a range of about 490 to 570 nm and 615 to 680 nm, respectively, with the correlated color temperature in a range of about 2500 to 10000 K set by adjusting the relative fluxes generated by the light-emitting diode and each of the phosphors, and wherein the chromaticity and lightness shifts are preserved for more than about 1000 different test color samples.

6. The lighting source of claim 5, wherein the correlated color temperature is about 6500 K, wherein the light-emitting diode has a peak wavelength of about 444 nm and an unabsorbed relative radiant flux of about 0.14 and the two phosphors have bandwidths of at least about 100 nm, peak wavelengths of about 513 nm and 635 nm, respectively, and relative radiant fluxes of about 0.47 and 0.39, respectively, and wherein the chromaticity and lightness shifts are preserved for more than about 1200 different test color samples.

7. The lighting source of claim 1, wherein the light-emitting diode has a peak wavelength in a range of about 430 to 475 nm and the set of phosphors comprises three phosphors with bandwidths of at least about 40 nm and peak wavelengths in a range of about 490 to 540 nm, 565 to 605 nm, and 635 to 675 nm, respectively, with the correlated color temperature in a range of about 2500 to 10000 K set by adjusting the relative fluxes generated by the light-emitting diode and each of the phosphors, and wherein the chromaticity and lightness shifts are preserved for more than about 1000 different test color samples.

8. The lighting source of claim 7, wherein the correlated color temperature is about 6500 K, wherein the light-emitting diode has a peak wavelength of about 446 nm and an unabsorbed relative radiant flux of about 0.21 and the three phosphors have bandwidths of at least about 50 nm, peak wavelengths of about 506 nm, 576 nm, and 649 nm, respectively, and relative radiant fluxes of about 0.29, 0.25, and 0.25, respectively, and wherein the chromaticity and lightness shifts are preserved for more than about 1200 different test color samples.

9. The lighting source of claim 1, wherein the blue light-emitting diode has a peak wavelength in a range of about 430 to 480 nm and a bandwidth of about 30 nm and the set of phosphors comprises at least one narrow-band phosphor with a bandwidth of at least about 5 nm and at least one wide-band phosphor with a bandwidth of at least about 30 nm, with the correlated color temperature in the range of about 2500 to 10000 K set by adjusting the relative fluxes generated by the light-emitting diode and each of the phosphors.

10. The lighting source of claim 9, wherein the blue light-emitting diode has a peak wavelength in a range of about 430 to 475 nm and the set of phosphors comprises a narrow-band phosphor with a peak wavelength in a range of about 630 to 670 nm and a wide-band phosphor with a bandwidth of at least about 180 nm and a peak wavelength in an interval of about 480 to 630 nm, with the correlated color temperature in the range of about 2500 to 10000 K set by adjusting the relative fluxes generated by the light-emitting diode and each of the phosphors, and wherein the chromaticity and lightness shifts are preserved for more than about 1000 different test color samples.

11. The lighting source of claim 10, wherein the correlated color temperature is about 6500 K, wherein the light-emitting diode has a peak wavelength of about 442 nm and an unabsorbed relative radiant flux of about 0.05, the narrow-band phosphor has a bandwidth of about 10 nm, peak wavelength of about 646 nm, and relative radiant flux of about 0.03, and the wide-band phosphor has a bandwidth of at least about 240 nm, peak wavelength of about 528 nm, and relative radiant flux of about 0.92, and wherein the chromaticity and lightness shifts are preserved for more than about 1200 different test color samples.

12. The lighting source of claim 9, wherein the light-emitting diode has a peak wavelength in a range of about 430 to 475 nm and the set of phosphors comprises a narrow-band phosphor with a peak wavelength in a range of about 640 to 675 nm, and two wide-band phosphors with bandwidths of at least about 50 nm and peak wavelengths in a range of about 490 to 545 nm and 575 to 620 nm, respectively, with the correlated color temperature in the range of about 2500 to 10000 K set by adjusting the relative fluxes generated by the light-emitting diode and each of the phosphors, and wherein the chromaticity and lightness shifts are preserved for more than about 1000 different test color samples.

13. The lighting source of claim 12, wherein the correlated color temperature is about 6500 K, wherein the light-emitting diode has a peak wavelength of about 448 nm and an unabsorbed relative radiant flux of about 0.20, the narrow-band phosphor has a bandwidth of about 10 nm, peak wavelength about 655 nm, and relative radiant flux of about 0.13, and the two wide-band phosphors have the bandwidths of at least about 60 nm, peak wavelengths of about 511 nm and 595 nm, respectively, and relative radiant fluxes of about 0.36 and 0.31, respectively, and wherein the chromaticity and lightness shifts are preserved for more than about 1200 different test color samples.

14. The lighting source of claim 1, further comprising:
controlling an unabsorbed relative flux of the light-emitting diode by controlling at least one of a driving current or absorption in the phosphors.

15. The lighting source of claim 1, wherein the peak wavelength is replaced by an average wavelength.

16. The lighting source of claim 1, wherein the chromaticity and lightness shifts are preserved within the predetermined values for test color samples contained in a Munsell palette.

17. The lighting source of claim 1, further comprising:
at least one package comprising the light-emitting diode and the set of phosphors.

18. The lighting source of claim 1, wherein the relative fluxes generated by each of the phosphors are determined by controlling at least one of: a concentration of phosphor particles in a phosphor converter layer; a thickness of the phosphor converter layer; a refraction index of materials forming the phosphor converter layer; a distance of the phosphor converter layer from the light emitting diode; or a location of the phosphor converter layer.

19. A lighting method, comprising:
generating white light, having a predetermined correlated color temperature, using a light emitter, the light emitter comprising a blue electroluminescent light-emitting diode, having a peak wavelength, generating a flux that is partially absorbed and converted to other wavelengths by a set of phosphors, each phosphor having a primary color, peak wavelength, and bandwidth, and with the peak wavelengths and relative fluxes generated by the light-emitting diode and the set of phosphors being selected such that in comparison with a reference lighting source, when each of more than fourteen different test color samples resolved by an average human eye as different is illuminated:
(a) chromaticity shifts with a chromatic adaptation of human vision taken into account are preserved within corresponding regions of a chromaticity diagram, each containing all colors that are indistinguishable, to the average human eye, from a color at a center of the region; and
(b) lightness shifts are preserved within predetermined values.

20. A method for generating white light having a predetermined correlated color temperature, comprising:
selecting a light emitter including a blue electroluminescent light-emitting diode, having a peak wavelength, generating a flux that is partially absorbed and converted to other wavelengths by a set of phosphors, each phosphor having a primary color, peak wavelength, and bandwidth, and with the peak wavelengths and relative fluxes generated by the light-emitting diode and the set of phosphors being selected such that in comparison with a reference lighting source, when each of more than fourteen different test color samples resolved by an average human eye as different is illuminated:
(a) chromaticity shifts with a chromatic adaptation of human vision taken into account are preserved within corresponding regions of a chromaticity diagram, each containing all colors that are indistinguishable, to the average human eye, from a color at a center of the region; and
(b) lightness shifts are preserved within predetermined values.

* * * * *